United States Patent
Harder

(10) Patent No.: US 7,457,657 B2
(45) Date of Patent: Nov. 25, 2008

(54) MAGNETIC RESONANCE METHOD AND APPARATUS FOR DETERMINING THE POSITION AND/OR ORIENTATION OF THE IMAGE PLANE OF SLICE IMAGE EXPOSURES OF A VESSEL REGION IN A CONTRAST AGENT BOLUS EXAMINATION

(75) Inventor: Martin Harder, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 604 days.

(21) Appl. No.: 11/040,970

(22) Filed: Jan. 21, 2005

(65) Prior Publication Data

US 2005/0203381 A1 Sep. 15, 2005

(30) Foreign Application Priority Data

Jan. 21, 2004 (DE) .................. 10 2004 003 081

(51) Int. Cl.
*A61B 5/05* (2006.01)
(52) U.S. Cl. ...................................... 600/420
(58) Field of Classification Search ............. 600/420, 600/410, 407, 413, 419, 431; 324/306, 309, 324/307, 130; 382/128
See application file for complete search history.

(56) References Cited

U.S. PATENT DOCUMENTS

| | | | |
|---|---|---|---|
| 5,719,498 A | 2/1998 | Hausmann | |
| 6,195,409 B1 | 2/2001 | Chang et al. | |
| 6,377,835 B1 * | 4/2002 | Schoenberg et al. | ........ 600/419 |
| 6,484,048 B1 | 11/2002 | Hoshino et al. | |
| 6,529,762 B1 | 3/2003 | Ladebeck | |
| 6,535,623 B1 * | 3/2003 | Tannenbaum et al. | ....... 382/128 |
| 6,728,566 B1 * | 4/2004 | Subramanyan et al. | ...... 600/407 |
| 6,760,611 B1 * | 7/2004 | Watanabe | ................... 600/410 |
| 6,782,284 B1 * | 8/2004 | Subramanyan et al. | ...... 600/407 |
| 6,792,066 B1 | 9/2004 | Harder et al. | |
| 6,842,638 B1 * | 1/2005 | Suri et al. | .................... 600/425 |
| 2003/0166999 A1 * | 9/2003 | Liu et al. | .................... 600/410 |
| 2004/0264752 A1 * | 12/2004 | Cline et al. | ................. 382/128 |
| 2005/0177042 A1 * | 8/2005 | Abe et al. | .................... 600/420 |
| 2006/0103678 A1 * | 5/2006 | Cathier et al. | ............... 345/649 |
| 2006/0184002 A1 * | 8/2006 | Yarnykh et al. | ............. 600/410 |

* cited by examiner

*Primary Examiner*—Eric F Winakur
*Assistant Examiner*—Lawrence N Laryea
(74) *Attorney, Agent, or Firm*—Schiff Hardin LLP

(57) ABSTRACT

In a method and a magnetic resonance system for determining the position and/or orientation of the image plane of slice image exposures of a vessel region in a contrast agent bolus examination, in particular in the region of the aorta bifurcation or the aorta arch, wherein the image plane traverses the vessel region in the longitudinal section, initially a group of slice image exposures disposed essentially orthogonal to the vessel is automatically acquired from different planes of the vessel region lying parallel to one another, and the image regions showing the vessel region are automatically determined within the orthogonal slice image exposures in an image-processing device, and using the determined image regions the spatial position of the vessel region is determined. The position and/or orientation of the image plane disposed essentially orthogonal to the planes of the slice image exposures and traversing the vessel region in the longitudinal section is determined automatically using the position information, such that the image plane lies in the center of the vessel region.

8 Claims, 2 Drawing Sheets

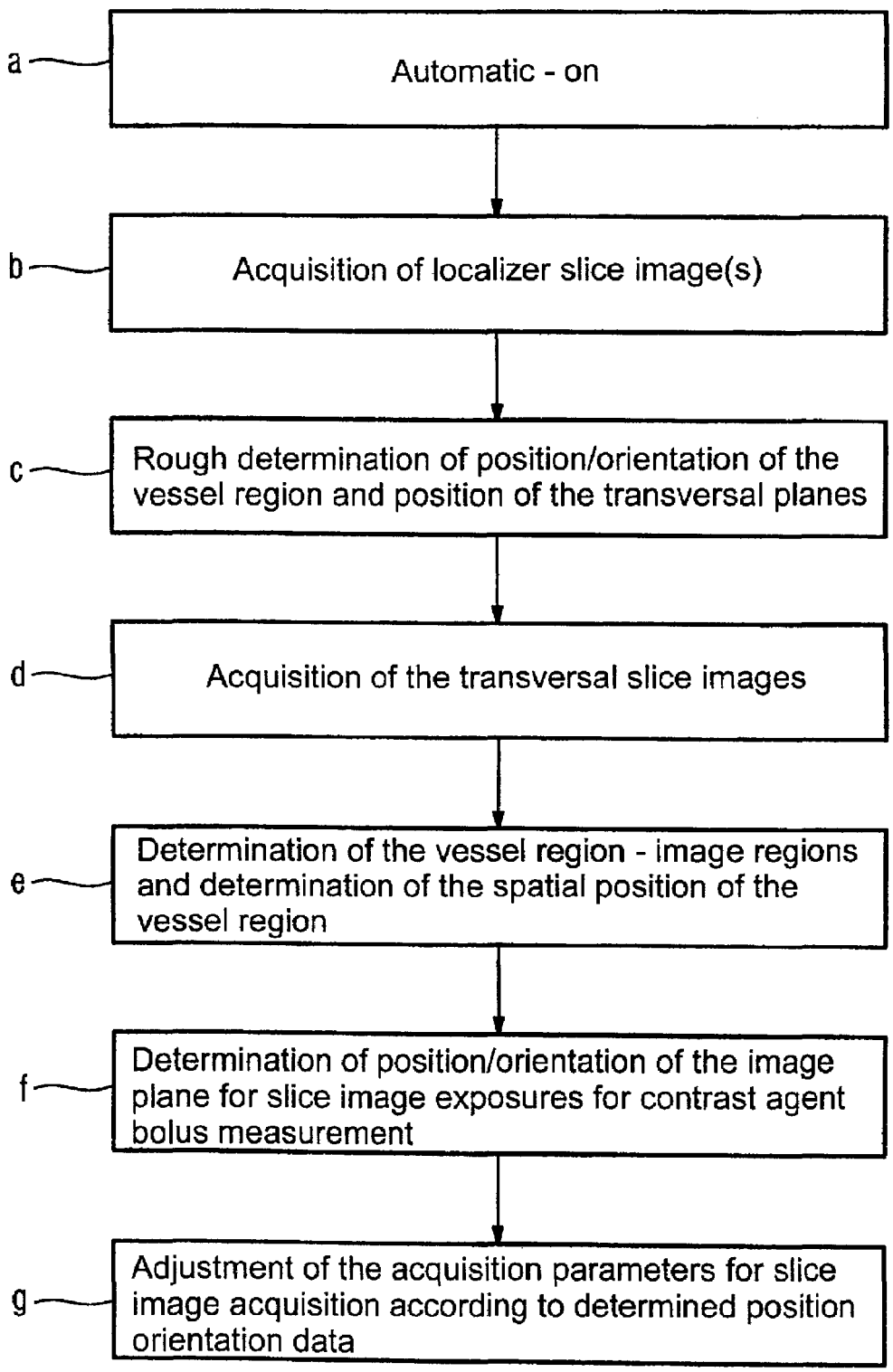

MAGNETIC RESONANCE METHOD AND APPARATUS FOR DETERMINING THE POSITION AND/OR ORIENTATION OF THE IMAGE PLANE OF SLICE IMAGE EXPOSURES OF A VESSEL REGION IN A CONTRAST AGENT BOLUS EXAMINATION

BACKGROUND OF THE INVENTION

1. Field of the Invention

The present invention concerns a method for determination with a magnetic resonance system of the position and/or orientation of the image plane of slice image exposures of a vessel region in a contrast agent bolus examination, in particular in the region of the aorta bifurcation or the aorta arch, wherein the image plane traverses the vessel region in the longitudinal section, and wherein a group of slice image exposures lying essentially orthogonal to the vessel is acquired from different planes of the vessel region.

2. Description of the Prior Art

A contrast agent bolus examination, frequently also called CareBolus measurement, serves for the determination of the flow-through time of the contrast agent in the framework of a magnetic resonance examination, for example in peripheral angiography. For an angiographic examination, the injection of a contrast agent is necessary in order to be able to depict very fine vessel structures in the acquired image. Problematic in these examinations is the determination of the start time for the actual angiography scan (imaging). This must be started when the contrast agent is present in sufficient concentration in the vessel or vessels of the respective body region to be examined. Otherwise it is not possible to acquire sufficiently high-contrast images, for example subtraction images. In order to be able to determine the correct point in time, Care-Bolus examination is implemented, in which a vessel region through which the contrast agent bolus proceeds is monitored via the magnetic resonance system. The point in time of the entrance of the contrast agent bolus into the slice image is used as a basis for the triggering of the subsequent angiography imaging.

In order to be able to detect the contrast agent bolus in a particular vessel region, for example, the region of the aorta bifurcation or the aorta arch, the region in question is monitored by magnetic resonance imaging. The image plane of the monitoring slice image is placed in the longitudinal direction proceeding through the vessel region in order to be able to monitor a certain vessel length and to be able to detect the incidence of the bolus in every case. In order to determine the slice plane, conventionally a number of slice images proceeding transversely to the vessel longitudinal axis are acquired using the magnetic resonance system. These slice Images are shown to the physician on a monitor and are evaluated by the physician with regard to the actual spatial course of the vessel region, and using this evaluation the position and/or orientation of the slice image plane is determined for the actual contrast agent bolus monitoring. The position/orientation of the plane depends on the position of the vessel region in the body of the patient with regard to the coordinate system of the magnetic resonance system.

Because the contrast agent bolus migrates relatively quickly, the bolus measurement is accorded central importance for the subsequent angiography examination. In the framework of the bolus monitoring, a decisive criterion is that the image plane of the bolus slice images be optimally positioned in order to be able to determine the arrival of the bolus as early as possible. This is even more critical in a magnetic resonance examination because the contrast agent generally can be administered only a single time in order to obtain high-contrast subtraction images. An injected contrast agent is not reabsorbed by the patient until hours later, during which another administration of contrast agent is not feasible.

German OS 102 21 642 discloses a method for slice tracking in the acquisition of images of time-dependent moving structures that enables a phase-dependent slice planning for triggered measurements based on slice position markings that are set manually by the operator. For this purpose, initially a number of time-dependent reference images are acquired that all lie in the same plane. In these reference images that show the examination region, dependent on its movement, in different positions, slice position markings are manually indicated by the physician that define the position of the image plane in which a slice image is subsequently to be acquired at the same point in time as the reference image. The relevant acquisition points in time of the respective reference image are automatically associated with the individual slice position markings as time markers.

From German OS 199 43 404, a method is known in which automatic overview images are acquired within which anatomical landmarks are identified. A determination subsequently ensues of the suitable measurement parameters for later image acquisition using previously acquired, stored overview images in the framework of a correlation. For this, a corresponding transformation of the currently acquired images ensues by displacement, rotation, stretching, compression, etc., with the transformation that has the best correlation coefficients being used for adaptation of the parameter to the measurement sequence.

U.S. Pat. No. 6,195,409 discloses a method in which structure information with regard to a subject shown in the image is acquired using a localizer image, with the determined structures correlated with corresponding comparison images, for which a rotation, displacement or the like is effected in order to find the best-coinciding correlation image. Using the image plane in which the best-coinciding correlation image was acquired, the corresponding image planes of the subsequent subject to be acquired are subsequently determined, which is accomplished using known transformation parameters that have been determined in the framework of the correlation.

German OS 195 29 636 also describes a method for spinal acquisitions, in the framework of which initially a sagittal overview image of the spinal column is acquired and shown to the physician on a monitor. The physician now designates lines in the representation that proceed through the individual intervertebral discs and that determine the image planes that should be subsequently acquired. This ensues manually via a computer mouse, etc. Once the slices are determined, the necessary subject volume is determined and subsequently the 3D date set is acquired.

U.S. Pat. No. 6,484,048 discloses a method for enabling an image representation via a suitable interface in the form of a monitor, wherein reference images again are involved in the framework of the image processing.

None of these known methods allows an exact, optimal determination of the image plane in which images for monitoring of the arrival of a contrast agent bolus have to be acquired in order to be able to exactly determine the point in time of the arrival.

SUMMARY OF THE INVENTION

An object of the present invention to provide a method that enables as optimal a determination as possible of the position/orientation of the image plane for contrast agent bolus measurement.

This object is achieved in accordance with the invention by a method for determination, with a magnetic resonance system, of the position and/or orientation of the image plane of slice image exposures of a vessel region in a contrast agent bolus examination, in particular in the region of the aorta bifurcation or the aorta arch, wherein the image plane traverses the vessel region in longitudinal section, and wherein initially a group of slice image exposures lying essentially orthogonal to the vessel is automatically acquired from different planes of the vessel region lying parallel to one another, and wherein the image regions showing the vessel region are automatically determined within the orthogonal slice image exposures by an image-processing device, and using the determined image regions the spatial position of the vessel region is determined, with the position and/or orientation of the image plane disposed essentially orthogonal to the planes of the slice image exposures and traversing the vessel region in the longitudinal section being determined automatically using the position information, such that the image plane lies in the center of the vessel region.

In the inventive method, the determination of the position/orientation of the image plane ensues fully automatically with a computer-controlled analysis of the orthogonal, for example transversally-situated, slice image exposures, preferably using a segmentation algorithm that, for example, determines the vessel regions in the respective slice image exposures via a contrast or flow measurement analysis. Using the known slice image positions of the individual vessel regions shown in the exposures, the image-processing device can determine or reconstruct the spatial position or the curvature of the vessel region in a very exact manner in the coordinate system of the magnetic resonance system, and determine the position/orientation of the image plane (and also of the vessel region anatomy) in a correspondingly exact manner based on the knowledge of the vessel region position. Depending on the position of the examined vessel, the position of the slice image exposure planes can be situated transversally (for example for location of the aorta bifurcation) or sagittally (for example for location of the aorta arch). In any case, they proceed essentially orthogonal to the vessel is longitudinal axis, thus substantially transverse to the vessel. Depending on the vessel position, they are thus transversal or sagittal slices. The term "orthogonal" is relatively broadly used herein, since naturally the actual position of the plane always depends on the local curvature of the vessel, which generally does not proceed in a straight line.

The inventive method affords a number of advantages. First, the determination ensues in a computer-controlled manner, meaning that the conventional manual evaluation of the transversal slice image exposures, which is inevitably plagued with errors, is not used. Also associated with this is a noticeable time savings in connection with the determination of the image plane, which is particularly advantageous since magnetic resonance examinations are increasingly being implemented for routine purposes. The performance of the MR examination can also be improved and a higher patient throughput can be achieved, and therewith the efficiency can be increased.

An operation simplification of the magnetic resonance system is also associated with the inventive method. For example, the medical-technical assistant has to operate only one operating element, for example in the form of an automatic key, in order to activate the automatic image plane determination. In the framework of this automatism, the acquisition of the orthogonal slice image exposures is initially activated via the control device (terminal console) of the magnetic resonance system, whereupon the described detection of the imaged vessel regions and the position determination as well as the plane determine ensues automatically.

If the position data of the image plane in the system-side coordinate system are known, it is appropriate to use these determined data for automatic control of the magnetic resonance system, i.e. the magnetic resonance system is automatically adjusted for the following bolus measurement corresponding to the determined position data.

To determine the positions and the orientation of the planes of the orthogonal slice image exposures to be acquired, at least one localizer slice image can be acquired before the acquisition of the orthogonal slice image exposure. Using this localizer slice image, the image-processing device determines the rough position and/or orientation of the vessel region and be position of the orthogonal planes of orthogonal slice image exposures to be subsequently acquired. The at least one localizer image exposure can be disposed sagittally or coronally; naturally it is also possible to acquire a number of such localizing first exposures that are situated differently relative to one another. Furthermore, it may be appropriate for rough position or orientation determination of the vessel region to iteratively acquire a number of localizer slice images in succession, with a previously acquired slice Image exposure being evaluated in the image-processing device and the next-acquired image exposure being acquired dependent on the evaluation result. The best possible position or, respectively, aspect for rough determination is thus approximated over a number of localizer slice images.

It is particularly appropriate when the acquisition of the localizer slice image(s) is also incorporated into the automatic process, such that a completely automatic operation results. This means that the operating personnel only has to manually, approximately position the patient in the magnetic resonance system, for example using a light-beam localizer that serves that roughly marks the acquired examination region. The automatic key is subsequently operated, whereupon the acquisition of the one or more localizer slice images initially ensues via the control device; the coarse determination of the position/orientation of the vessel region and position/orientation of the orthogonal planes is subsequently automatically determined for the transversal slice images that are subsequently acquired initiated by the control device, whereupon the evaluation is determined in the previously described manner for determination of the image plane for the contrast agent bolus measurement, and the date are set on the part of the control device for the subsequent actual measurement.

In addition to the method, the invention also concerns a magnetic resonance system that is fashioned to implement the aforementioned method.

DESCRIPTION OF THE DRAWINGS

FIG. 3 is a flowchart for automatic image plane determination operation in accordance with the invention.

DESCRIPTION OF THE PREFERRED EMBODIMENTS

Figure 1:
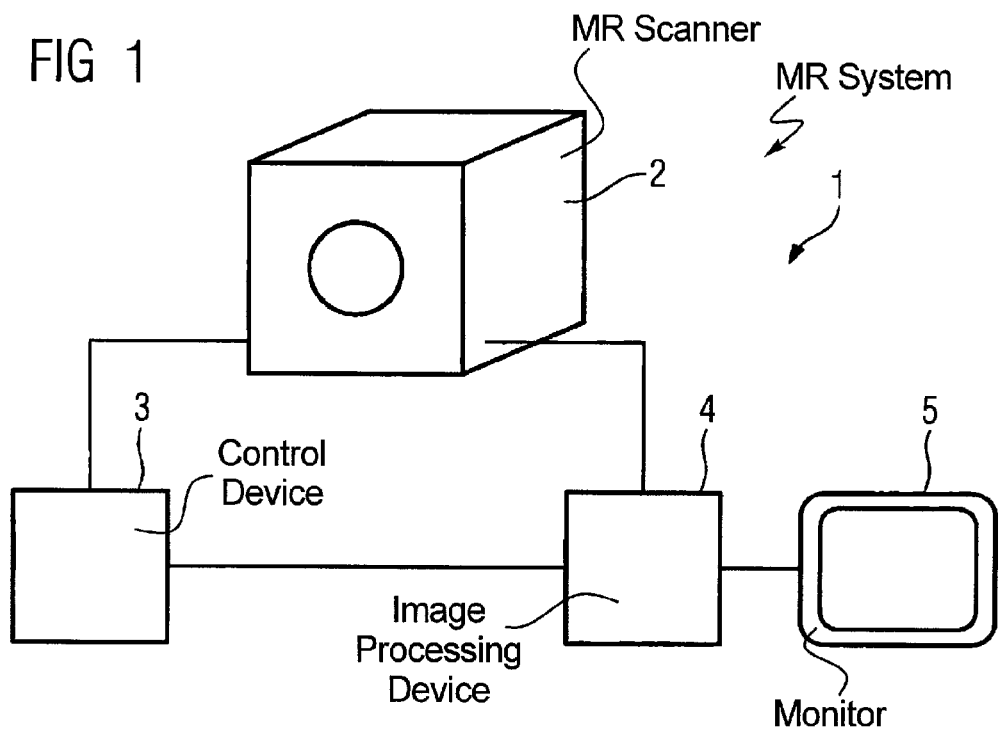
FIG. 1 is a basic diagram of a magnetic resonance system operable according to the present invention.

FIG. 1 shows an inventive magnetic resonance system having a scanner 1 in which a patient is positioned, a control device 3 for controlling the image acquisition operation as well as an image-processing device 4 for generation and output of the slice images using the acquired image signals on a monitor 5.

Figure 2:
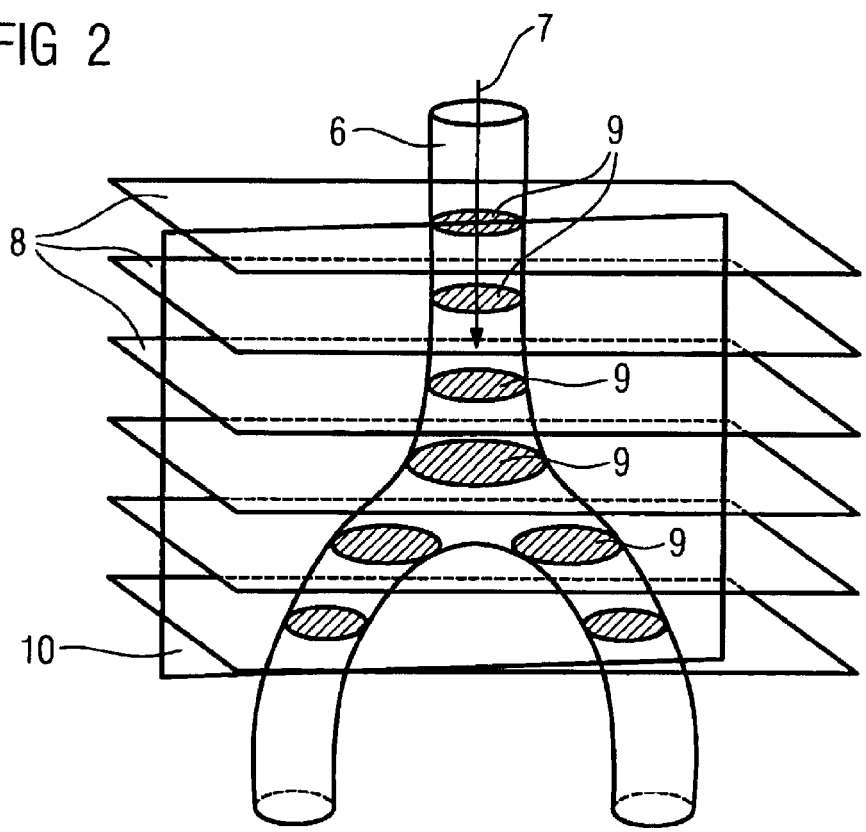
FIG. 2 Illustrates determination of the position/orientation of the image plane for contrast agent bolus measurement using transversal slice image exposures in accordance with the invention.

The actual image acquisition is initiated via the control device 3. A contrast agent bolus examination is to be implemented, with the bolus being present in a vessel region 6, for example the aorta bifurcation as shown in FIG. 2. The flow direction of the blood, and inevitably also of the contrast agent bolus to be detected, is indicated by the arrow 7. A rough position/orientation determination with regard to the position of the vessel region 6 is initially implemented using one or more localizer slice images (not shown in detail in FIG. 2). As a consequence, the position and orientation of the transversal planes serving for the subsequent image plane determination, in which transversal planes transversal slice images are acquired, are also roughly determined.

FIG. 2 shows a number of transversal slice images 8 that virtually transect the vessel region 6. Because only the aorta bifurcation is shown, the planes proceed transversally. In the case of examination, of the aorta arc, for example, the slice image planes would lie sagittally. In each of the transversal slice images, an image region 9 representing the vessel region 6 is shown. The transversal slice images 8 are now evaluated using an evaluation algorithm, for example a segmentation algorithm or an algorithm for grey value analysis, so that the image region 9 shown in each transversal slice image is determined, for example by contrast analysis. Using the number of image regions 9 that differ in the image plane 10, the image-processing device determines the spatial position and orientation of the vessel region of interest 6 in the coordinate system of the magnetic resonance system and the vessel region can be imaged in terms of its anatomy. Using this position information in the form of corresponding coordinates and image data, the position and orientation of the image plane 10, in which the slice image acquired during the contrast agent bolus measurement is acquired, can now be determined, This image plane 10 proceeds essentially orthogonal to the transversal planes of the transversal slice images 8, as shown in FIG. 2, and thus in the longitudinal direction of the vessel region 6; a longitudinal section is thus acquired. The image plane 10 is optimally, exactly situated in the middle of the vessel region 6, since the flow speed of the contrast agent bolus in the vessel middle is largest and the anticipated stream of the contrast agent bolus, thus the bolus leading front, lies in the middle. If the coordinates (position) or orientation data of the image plane are known, these are supplied to the control device, which correspondingly adjusts the image acquisition parameters in order to be able to subsequently initially implement an overview or planning exposure that enables the operator to survey or plan the automatic image plane determination. After enabling by the operator, the actual contrast agent bolus examination can then ensue, for which initially the contrast agent is injected and subsequently the determined image plane is continuously monitored until arrival of the bolus and subsequently the diagnostic imaging, such as angiography imaging, is effected.

In a flowchart, FIG. 3 shows the basic strips of the automatic program for automatic determination of the image plane data in the case of the examination of the aorta bifurcation based on transversal slice images. In step a, the automatic function is entered by the operator by operation of a suitable automatic button or the like. After this, the control device 3 automatically activates the acquisition of one or more localizer slice images (step b), meaning that initially the surroundings of the vessel region, thus for example the aorta bifurcation, is acquired. After this, in step c a rough determination of the position/orientation of the vessel region follows via the image-processing device 4, thus it is checked where the vessel region approximately lies in space and how it is aligned. A determination of the position of the transversal planes as specified in step c is simultaneously implemented, in which transversal planes the transversal slice images (thus slice images transverse to the longitudinal direction of the vessel region) are subsequently acquired (step d). These are now evaluated by the image-processing device 4 in step e for determination of the image regions in which the "sliced" vessel region is shown, and also the spatial position of the vessel region is determined with regard to the coordinate system of the magnetic resonance system. Using this information, in step f the precise position and orientation of the image plane, which can also be doubled with regard to the coronal and sagittal body axis, is now determined. The determined acquisition parameters for the slice image exposure for contrast agent bolus measurement are subsequently adjusted according to the determined position/orientation data that were determined for the image plane in step g. A complete automation thus results.

Insofar as the automation described in the steps b and c for acquisition of the localizer slice image(s) and the rough determination of the vessel region and the position of the transversal plane is not desired (rather the parameters therefor are entered manually), these steps naturally can be omitted. The automatic operation would then proceed using the steps a and d-g.

If the vessel is situated differently and a number of sagittally proceeding planes have to be determined as an orthogonal plane, in step c the positions of the sagittal planes would be determined and in the step d the sagittal slice images that are subsequently evaluated would be acquired.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining at least one of a position and orientation of an image plane of a plurality of slice image exposures of a vessel region in a magnetic resonance contrast agent bolus examination, comprising the steps of:

automatically acquiring a plurality of slice image exposures in respectively different planes of a vessel region encompassing a vessel into which a contrast agent bolus is yet to be administered, said slice image exposures being disposed parallel to each other and substantially orthogonally to the vessel;

automatically electronically determining respective image regions, showing said vessel region, in said orthogonal slice image exposures in an image processor;

using the determined image regions, automatically electronically determining a spatial position of said vessel region in said image processor;

in said image processor automatically electronically determining at least one of a position and orientation of an image plane, disposed substantially orthogonal to the respective planes of the slice image exposures and traversing said vessel region in longitudinal section, using said spatial position of said vessel region, said image plane being disposed in a center of said vessel region;

subsequently administering said contrast agent bolus and monitoring progress of said contrast agent bolus through said vessel using an image of said vessel region obtained in said image plane.

2. A method as claimed in claim 1 comprising obtaining said slice image exposures of a region containing the aorta arch, as said vessel region.

3. A method as claimed in claim 1 comprising obtaining said slice image exposures of a region containing the aorta bifurcation, as said vessel region.

4. A method as claimed in claim 1 comprising automatically electronically determining the respective image regions in said plurality of slice image exposures using a segmentation algorithm.

5. A method as claimed in claim 1 comprising using said at least one of said position and orientation of said image plane for automatically controlling said magnetic resonance system.

6. A method as claimed in claim 1 comprising acquiring at least one localizer slice image before acquiring said slice image exposures, and using said localizer slice image in said image processor to determine at least one of a coarse position and a coarse orientation of said vessel region and the respective positions of the planes of said slice image exposures.

7. A method as claimed in claim 6 comprising obtaining a plurality of localizer slice images in succession.

8. A magnetic resonance apparatus comprising:

a magnetic scanner that automatically acquires a plurality of slice image exposures in respectively different planes of a region encompassing a vessel into which a contrast agent bolus is yet to be administered, said slice image exposures being disposed parallel to each other and substantially orthogonally to the vessel;

an image processor supplied with said slice image exposures, said image processor automatically determining respective image regions, showing said vessel region, in said orthogonal slice image exposures;

said image processor using the determined image regions, automatically determining a spatial position of said vessel region, and automatically determining at least one of a position and orientation of an image plane, disposed substantially orthogonal to the respective planes of the slice image exposures and traversing said vessel region in longitudinal section, using said spatial position of said vessel region, said image plane being disposed in a center of said vessel region; and a display connected to said image processor at which said image processor causes an image of said vessel region, obtained in said slice place after administration of a contrast agent bolus to allow visual monitoring of progress of said contrast agent bolus through said vessel.

* * * * *